(12) United States Patent
Minotti

(10) Patent No.: US 9,099,432 B2
(45) Date of Patent: Aug. 4, 2015

(54) ELECTRONIC DEVICE FOR POWER APPLICATIONS

(75) Inventor: Agatino Minotti, Mascalucia (IT)

(73) Assignee: STMicroelectronics S.r.l., Agrate Brianza (IT)

(*) Notice: Subject to any disclaimer, the term of this patent is extended or adjusted under 35 U.S.C. 154(b) by 347 days.

(21) Appl. No.: 13/484,092

(22) Filed: May 30, 2012

(65) Prior Publication Data

US 2013/0320570 A1 Dec. 5, 2013

(51) Int. Cl.
*H01L 23/28* (2006.01)
*H01L 23/40* (2006.01)

(52) U.S. Cl.
CPC ........ *H01L 23/4006* (2013.01); *H01L 23/4093* (2013.01); *H01L 2924/0002* (2013.01); *H01L 2924/1815* (2013.01)

(58) Field of Classification Search
USPC .......................................... 257/692, 677, 693
See application file for complete search history.

(56) References Cited

U.S. PATENT DOCUMENTS

2001/0018235 A1* 8/2001 Choi .............................. 438/122

* cited by examiner

*Primary Examiner* — Samuel Gebremariam
(74) *Attorney, Agent, or Firm* — Seed IP Law Group PLLC

(57) ABSTRACT

An electronic device for power applications and configured for being mounted on a printed circuit board is disclosed. The electronic device includes a semiconductor chip integrating a power component, and a package. The package comprises an insulating body embedding the semiconductor chip, and exposed electrodes for electrically connecting conductive terminals of the semiconductor chip to external circuitry in the printed circuit board. The electronic device is further configured to be fastened to a heatsink with a back surface of the insulating body in contact with a main surface of the heatsink for removing heat produced by the electronic device during the operation thereof. The insulating body lacks of a fixing portion in which a hole for receiving an insertable fastener element for the fastening of the electronic device to the heatsink is located.

15 Claims, 5 Drawing Sheets

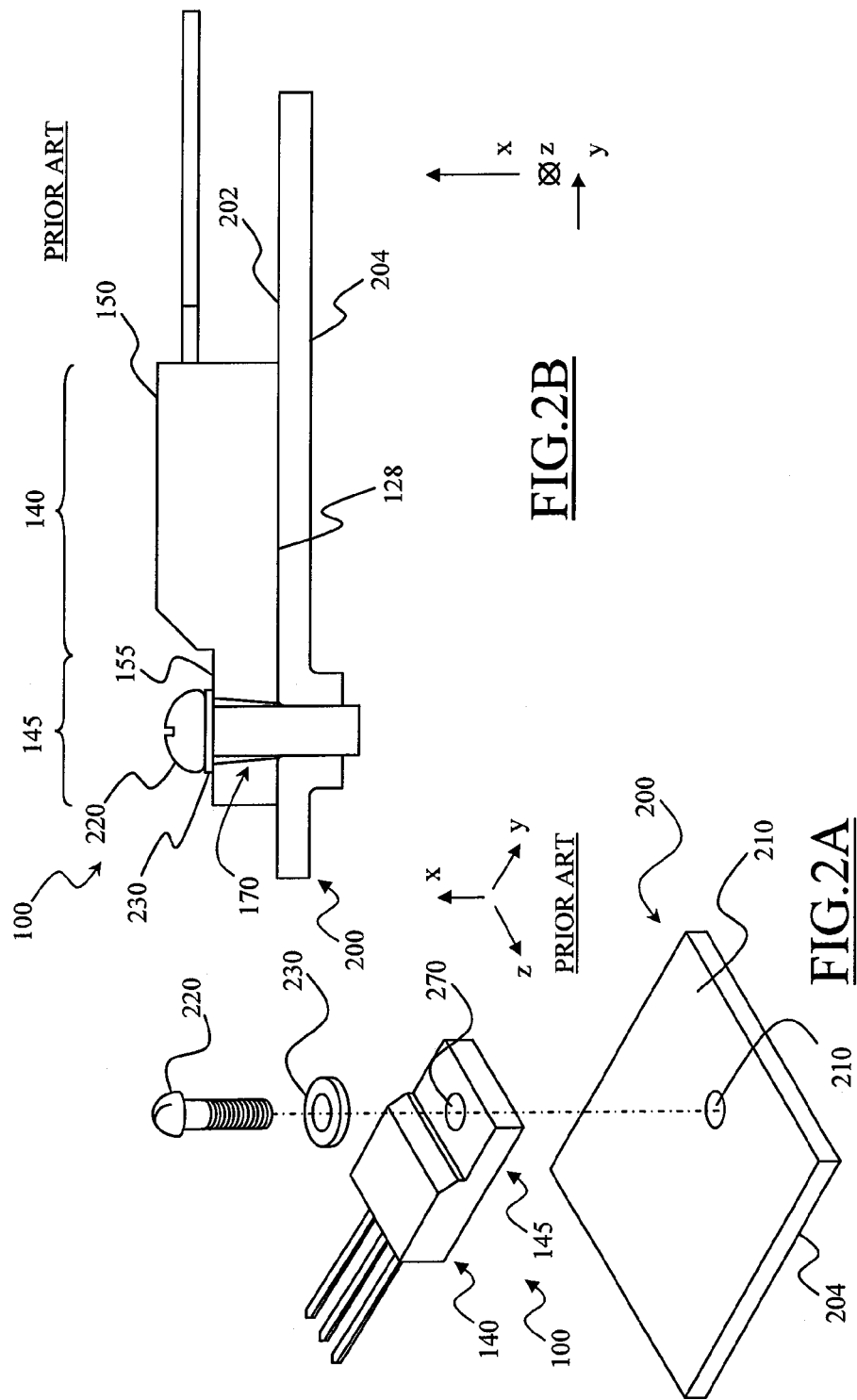

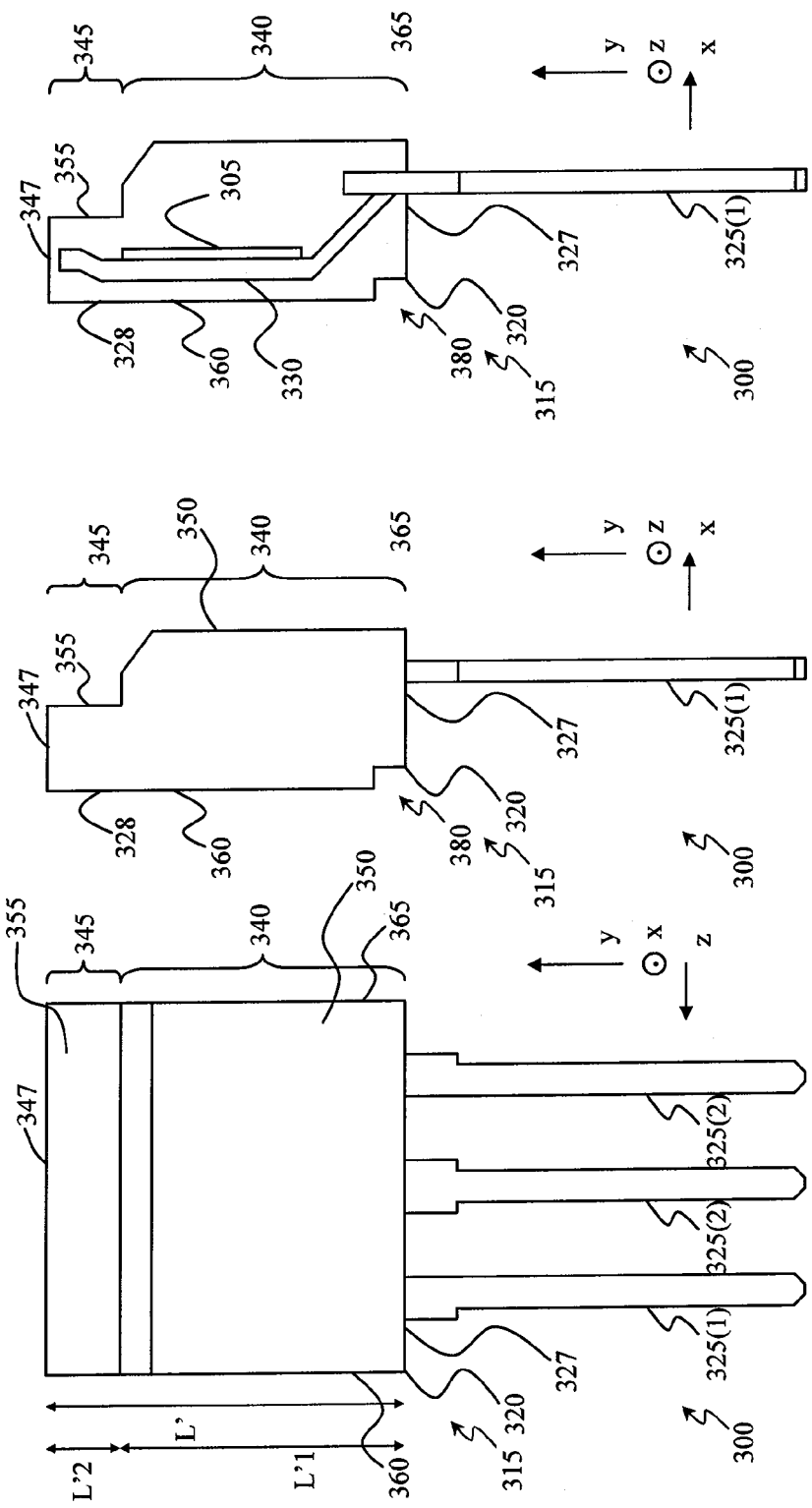

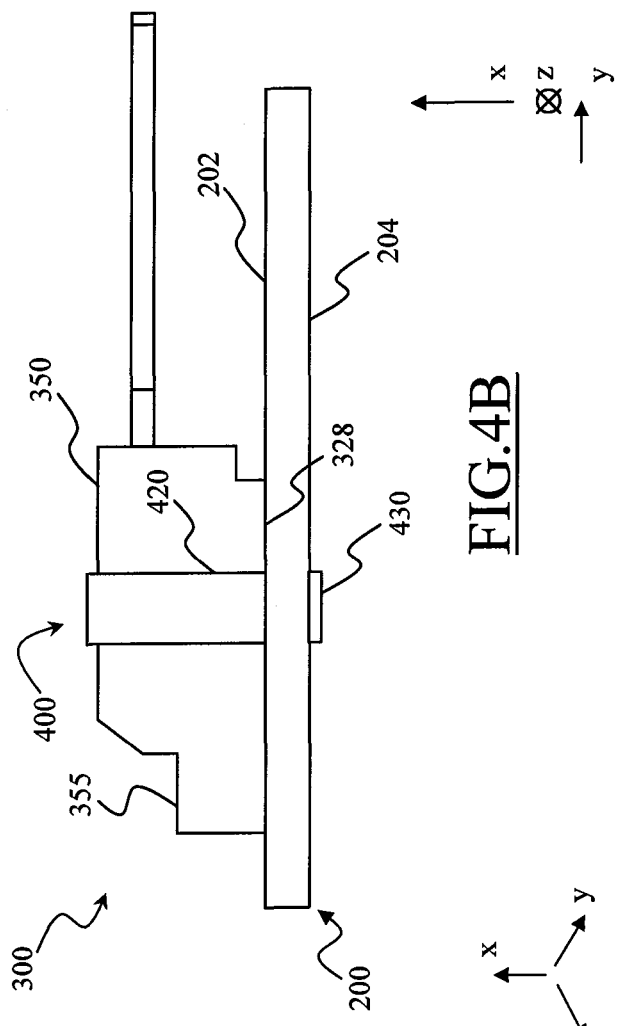
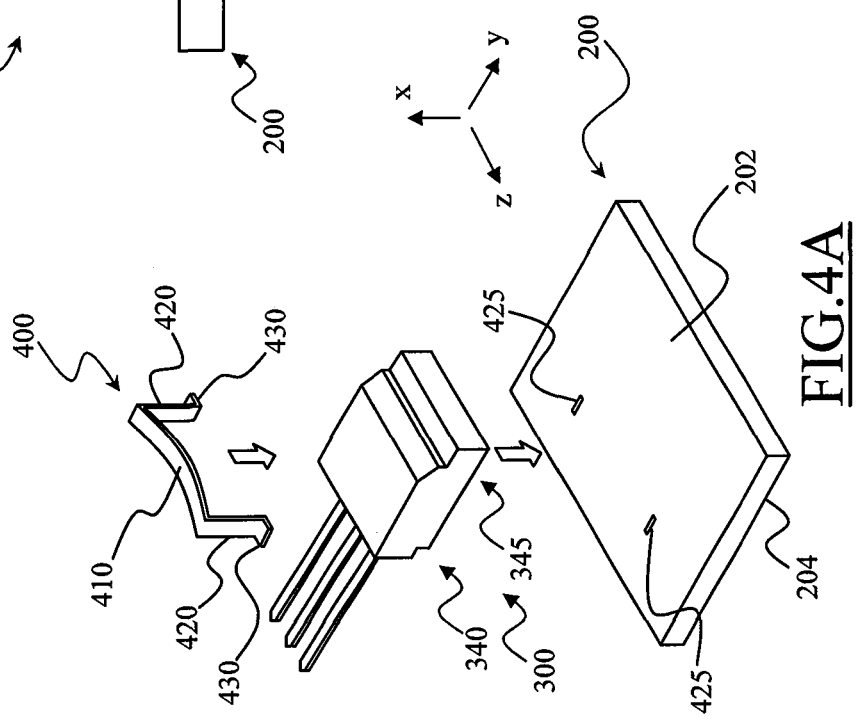
FIG.4B
FIG.4A

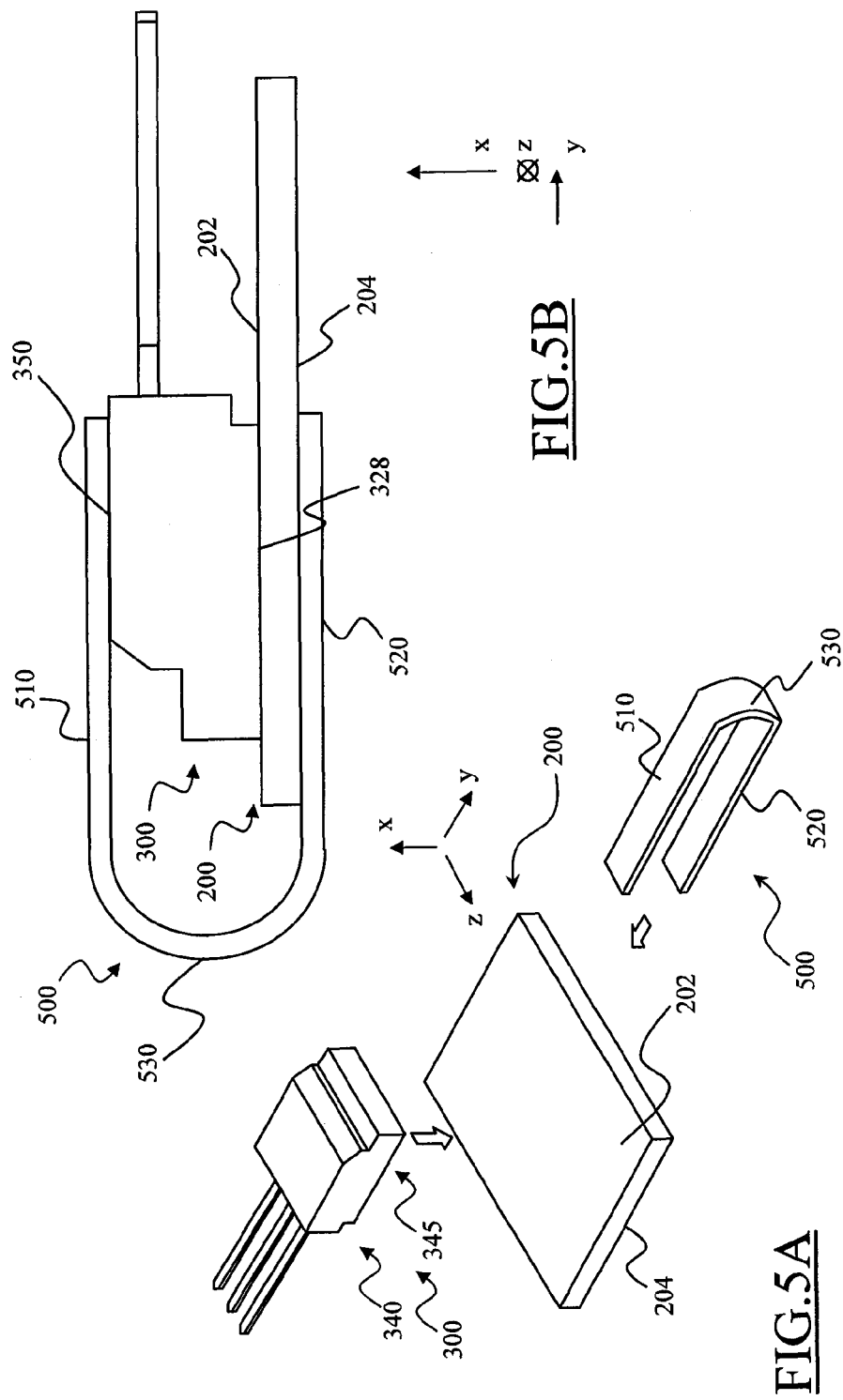

ELECTRONIC DEVICE FOR POWER APPLICATIONS

BACKGROUND

1. Technical Field

The solution according to one or more embodiments of the present disclosure relates to the electronics field. More specifically, such solution relates to electronic devices for power applications.

2. Description of the Related Art

Each electronic device typically comprises a chip—for example, of semiconductor material—on which components and/or electronic circuits are integrated, and a package in which the chip is embedded for protecting it and for allowing access to terminals thereof. The chip of an electronic device for power applications (e.g., AC adapters), hereinafter simply referred to as power device, typically integrates a power component, such as a power transistor of the MOS or BJT type, or a power diode.

The package of a power device comprises an insulating body having exposed leads, which are electrically connected to corresponding terminals of the chips (e.g., by a "wire-bonding" technique). The leads of the package are used for connecting the same (and thus the corresponding terminals of the chips) to external circuits. For such purpose, the power device is usually mounted on a printed circuit board (PCB), for example by surface mounting technology (or SMT), wherein the leads of the package comprise pads that are first fixed to corresponding conductive tracks of the PCB by a slight pressure (pick and place), and then reflow-welded on the same, or by through-hole technology (or THT), wherein the leads of the package comprise electrodes that are inserted into through-holes of the PCB and back-welded on it.

Semiconductors do not perform well at elevated temperature. However, since the chip of a power device is affected by high voltages and/or currents, it tends to heat up. Therefore, the power devices are cooled by removing that heat continuously. For this reason, heatsinks are provided to remove heat from the power device (and particularly, from the chip) by conducting it to the external environment through the package. Making reference in particular to a power device provided with electrodes, the heatsink is typically a metallic plate adapted to contact the package of the power device when the latter is mounted on the PCB. In order to remove heat from the power device in an efficient way, so as to keep the temperature thereof at safe levels, the package of the power device should be attached to the heatsink in such a way that a sufficiently large surface portion of the insulating body is in direct contact with the heatsink itself.

According to a solution known in the art, the package of the power device is configured to be fastened to the heatsink by means of an insertable fastener, such as for example a screw, configured to go through the insulating body. For this purpose, the insulating body of the package, as well as the heatsink, are provided with corresponding through-holes adapted to receive the screw. The position of the holes is such that, when the power device is mounted to the PCB (i.e., when the electrodes thereof are inserted into through-holes of the PCB), the hole on the package is aligned with the hole on the heatsink; having mounted the power device on the PCB, the power device is then firmly fastened to the heatsink by inserting the screw inside the two aligned holes.

The Applicant has observed that a solution of this type is not suitable for all the applications affected by size constraints, such as for example the AC adapters, whose size imposed by the actual demands is becoming more and more reduced. Indeed, with the abovementioned solution, the insulating body of each power device included in an AC adapter has to include a dedicated fixing portion in which the hole for receiving the insertable fastener is located. In order to correctly allow the passage of the insertable fastener through the hole avoiding any risk of damaging the chip wherein the power component is integrated, such fixing portion of the insulating body has to be located apart from the location of the chip. For this reason, the fixing portion is typically an additional protruding portion of the insulating body, whose presence sensibly increases the whole size of the power device.

BRIEF SUMMARY

In its general terms, the solution according to one or more embodiments of the present disclosure is based on the idea of employing an insulating body without a dedicated fixing portion in which an hole for receiving an insertable fastener element would be located. With an insulating body of such type, the power device can be fastened to the heatsink by an elastic fastener element configured to be placed astride a corresponding portion of the insulating body itself.

In particular, some embodiments of the disclosure are set out in the independent claims, with advantageous features of some embodiments being indicated in the dependent claims, whose wording is enclosed herein verbatim by reference (with any advantageous feature being provided with reference to a specific aspect of the solution according to an embodiment of the disclosure that applies mutatis mutandis to any other aspect).

More specifically, one embodiment of the present disclosure provides an electronic device for power applications and configured for being mounted on a printed circuit board. The electronic device includes a semiconductor chip integrating a power component, and a package. The package comprises an insulating body embedding the semiconductor chip, and exposed electrodes for electrically connecting conductive terminals of the semiconductor chip to external circuitry in the printed circuit board. The electronic device is further configured to be fastened to a heatsink with a back surface of the insulating body in contact with a main surface of the heatsink for removing heat produced by the electronic device during the operation thereof. The insulating body lacks a fixing portion for a hole for receiving an insertable fastener element for the fastening of the electronic device to the heatsink.

These and other features and advantages of the present disclosure will be better understood with reference to the following detailed description, given purely by way of a non-restrictive indication, to be read in conjunction with the accompanying drawings (wherein corresponding elements are denoted with equal or similar references, and their explanation is not repeated for the sake of exposition brevity). In particular, it is expressly understood that the figures are not necessarily drawn to scale (with some details that could be exaggerated and/or simplified) and that, unless otherwise indicated, they are simply used for conceptually illustrating the described structures and procedures. In particular:

BRIEF DESCRIPTION OF THE SEVERAL VIEWS OF THE DRAWINGS

FIG. 2A is a perspective view illustrating how the power device of FIGS. 1A-1C is mounted on a heatsink according to a solution known in the art;

FIG. 2B is a cross-sectional view of the power device of FIGS. 1A-1C when mounted on the heatsink according to a solution known in the art;

FIG. 3A is a schematic front view of a power device according to an embodiment of the present disclosure;

FIG. 3B is a schematic side view of the power device of FIG. 3A;

FIG. 3C is a see-through view of the power device of FIGS. 3A, 3B viewed from side;

FIG. 4A is a perspective view illustrating how the power device of FIGS. 3A-3C is mounted on a heatsink according to an embodiment of the present disclosure;

FIG. 4B is a cross-sectional view of the power device of FIG. 4A when mounted on the heatsink according to an embodiment of the present disclosure;

FIG. 5A is a perspective view illustrating how the power device of FIGS. 3A-3C is mounted on a heatsink according to a further embodiment of the present disclosure, and FIG. 5B is a cross-sectional view of the power device of FIG. 5A when mounted on the heatsink according to a further embodiment of the present disclosure.

DETAILED DESCRIPTION

Figures 1A, 1B, 1C:
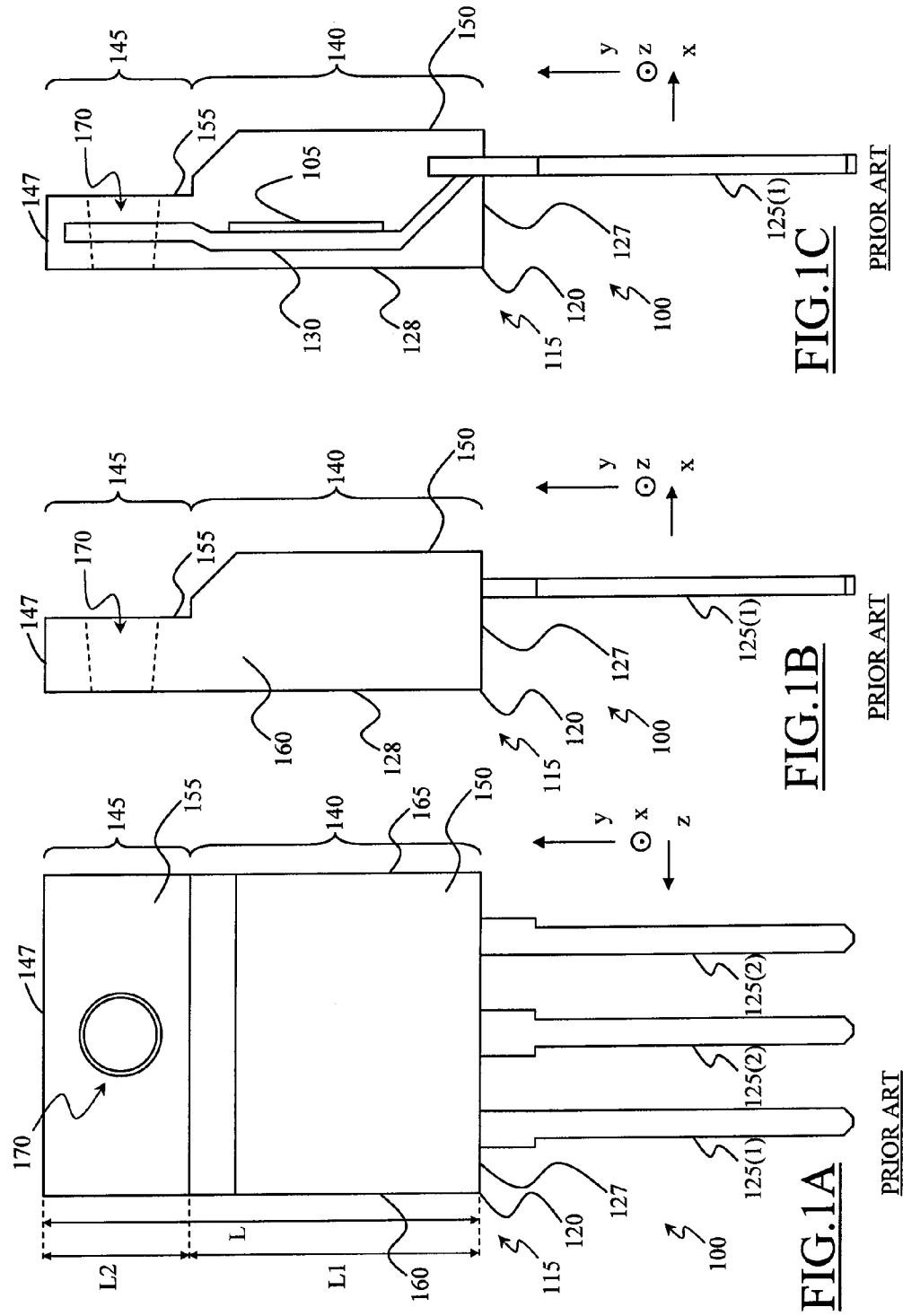
FIG. 1A is a schematic front view of a power device according to a solution known in the art.
FIG. 1B is a schematic side view of the power device of FIG. 1A.
FIG. 1C is a see-through view of the power device of FIGS. 1A, 1B viewed from side.

With reference to the drawings, FIGS. 1A, 1B and 1C illustrate a power device 100 according to a solution known in the art. FIGS. 1A and 1B are schematic front and side views, respectively, of the power device 100, while FIG. 1C is a see-through view of the power device 100 viewed from side.

The power device 100 is suitable to be employed in power systems, such as in an AC adapter, and comprises, as visible in FIG. 1C, a semiconductor chip 105 integrating a power component.

The power device 100 further comprises a package 115, for example of the "Fully-Molded" type, which comprises an insulating body 120 (e.g., of plastic or ceramic material), which embeds the chip 105, and exposed leads (e.g., three) for connecting the power device 100 to external circuitry (not shown) by, for example, a PCB, also not shown.

The exemplary power device 100 illustrated in FIGS. 1A, 1B and 1C is configured for being mounted on the PCB by using "Through-Hole Technology" (or THT). In this respect, making reference to the coordinate system x, y and z depicted in the figures, the leads of the package 115 are in the form of electrodes 125(1), 125(2), 125(3), which extend downward, along the direction y, beyond a lower end 127 of the insulating body 120, which substantially lays on a plane parallel to the directions x and z. The electrodes 125(1), 125(2), 125(3) are configured to be inserted along a mounting direction parallel to the direction y into through-holes of the PCB (not visible in figure) and back-welded on it. The insulating body 120 has a substantially flat back surface 128, which—as will be described later on—is configured to contact a surface of a heatsink when the power device 100 is mounted on a PCB for removing heat produced during the operation of the power device 100. The back surface 128 substantially lays on a plane parallel to the directions y and z.

The power device 100 further comprises, within the package 115, a conductive support element 130 ("lead frame"), which generally acts as mechanical support for the chip and as electrical contact for one or more terminals thereof. The support element 130 comprises a support surface 130s on which the power chip 105 is mounted.

In the exemplary power device 100 illustrated in FIGS. 1A, 1B and 1C, the insulating body 120 has a lower section, hereinafter referred to as main portion 140 and an upper section, hereinafter referred to as fixing portion 145. The main portion 140 extends upward along the direction y from the lower end 127 of the insulating body 120 to a lower end of the fixing portion 145. The fixing portion 145 extends upward along the direction y from an upper end of the main portion 140 to an upper end 147 of the insulating body 120. The back surface 128 of the insulating body 120 is shared by both the portions 140 and 145. The main portion 140 comprises a substantially flat front face 150 which is substantially parallel to the back surface 128; similarly, the fixing portion 145 comprises a substantially flat front face 155 which is substantially parallel to the back surface 128. The insulating body 120 further comprises two opposite lateral faces 160, 165 parallel to the directions y and x.

The total length L—along the direction y—of the insulating body 120 is substantially equal to the length L1—along the direction y—of the main portion 140 plus the length L2—along the direction y—of the fixing portion 145. In the example at issue, the thickness—along the direction x—of the main portion 140 is higher than the thickness of the fixing portion 145; within the insulating body 120, the support element 130 extends upward along both the main portion 140 and the fixing portion 145. The support surface 130s of the support element 130 wherein the chip 105 is mounted is located at the main portion 140 of the insulating body 120, so that the main portion 140 is the portion of the insulating body 120 which actually embeds the chip 105. The fixing portion 145 comprises a hole 170, which extends along the direction x, from the face 155 to the face 128, for receiving an insertable fastener element.

FIG. 2A is a perspective view illustrating how the power device 100 of FIGS. 1A-1C is mounted on a heatsink 200 according to a solution known in the art. The heatsink 200 is in the form of a metallic plate having first and second opposite main faces 202, 204, and it is provided with a hole 210 adapted to receive an insertable fastener element, and particularly the same insertable fastener element which the hole 170 located on the fixing portion 145 is designed to receive. As already mentioned in the introductory part of the present document, according to a solution known in the art the power device 100 is mounted on the heatsink 200 by aligning—along the direction x—the hole 170 located on the fixing portion 145 of the power device with the hole 210 of the heatsink 200, and then by inserting an insertable fastener element, such as a threaded screw 220, through the two aligned holes 150, 210. Once the threaded screw 220 has been screwed into the two aligned holes 170, 210, the power device 100 is firmly fastened to the heatsink 200, with the back surface 128 of the insulating body 120 in contact with the face 202 of the latter, as illustrated in the cross-sectional view depicted in FIG. 2B. In order to distribute the load of the threaded screw 220, so as not to damage the fixing portion 145 of the power device 100, a washer 230 is usually inserted between the threaded screw 200 and the fixing portion 145.

According to an embodiment of the present disclosure, the size of the power device is sensibly reduced by employing an insulating body without a dedicated fixing portion and an hole for receiving an insertable fastener element. With the insulating body according to the disclosure, the power device is fastened to the heatsink by an elastic fastener element configured to be placed astride a corresponding portion of the insulating body itself.

FIGS. 3A, 3B and 3C illustrate a power device 300 according to an embodiment of the present disclosure. FIGS. 3A and 3B are schematic front and side views, respectively, of the power device 300, while FIG. 3C is a see-through view of the power device 300 viewed from a side.

Like the power device 100 of FIGS. 1A, 1B and 1C, the power device 300 is suitable to be employed in power systems, such as in an AC adapter, and comprises, as visible in FIG. 3C, a semiconductor chip 305 integrating a power component (e.g., a MOS or BJT power transistor, or a power diode). The power device 300 further comprises a package 315 of the "Fully-Molded" type, which comprises an insulating body 320 (e.g., of plastic or ceramic material), which embeds the chip 305, and exposed leads(e.g., three) for electrically connecting conductive terminals of the semiconductor chip 305 to external circuitry (not shown) by, for example, a PCB, also not shown.

The power device 300 is configured for being mounted on the PCB by using "Through-Hole Technology". In this respect, the leads of the package 315 are in the form of electrodes 325(1), 325(2), 325(3), which extend downward, along the direction y, beyond a lower end 327 of the insulating body 320, which substantially lays on a plane parallel to the directions x and z. The electrodes 325(1), 325(2), 325(3) are apt to be inserted along a mounting direction parallel to the direction y into through-holes of the PCB (not visible in figure) and back-welded on it. The insulating body 320 has a substantially flat back surface 328, which—like the surface 128 of the insulating body 120 of FIGS. 1A-1C—is configured to contact a surface of a heatsink when the power device 100 is mounted on a PCB for removing heat produced during the operation of the power device 300. The back surface 328 lays on a plane parallel to the directions y and z.

The power device 300 further comprises, within the package 315, a conductive support element 330, which generally acts as mechanical support for the chip and as electrical contact for one or more terminals thereof. The support element 330 comprises a support surface 330s on which the power chip 305 is mounted.

The insulating body 320 of the power device 300 according to an embodiment of the present disclosure comprises a lower section 340 and an upper section 345, with the lower section that 340 extends upward along the direction y from the lower end 327 of the insulating body 320 to a lower end of the upper section 345, and the upper section 345 which extends upward along the direction y from an upper end of the lower section 340 to an upper end 347 of the insulating body 320, which is substantially parallel to the lower end 327. The back surface 328 of the insulating body 320 is shared by both the portions 340 and 345. The lower section 340 comprises a substantially flat front face 350 which is substantially parallel to the back surface 328; similarly, the upper section 345 comprises a substantially flat front face 355 which is substantially parallel to the back surface 328. The insulating body 320 further comprises two opposite lateral faces 360, 365 parallel to the plane defined by the directions y and x.

The thickness (along the direction x) of the lower section 340 is higher than the thickness of the upper section 345; within the insulating body 320, the support element 330 extends upward along both the lower section 340 and the upper section 345.

The total length L'1—along the y direction—of the insulating body 120 is substantially equal to the length L'1—along the y direction—of the lower section 440 plus the length L'2—along the y direction—of the upper section 345. Unlike the fixing portion 145 of the known power device 100 illustrated in FIGS. 1A, 1B, 1C, whose front surface is large enough to house a hole for receiving an insertable fastener element, the upper section 345 of the power device 300 according to an embodiment of the present disclosure does not have to house a hole for receiving an insertable fastener element, and therefore its size is advantageously kept small. In particular, the length L'2 of the upper section 345 is advantageously smaller than the length L2 of the fixing portion 145 (see FIGS. 1A-1C), so that the total length L'—and thus the whole size—of the package 320 of the power device 300 according to an embodiment of the present disclosure is smaller than the total length L—and thus the whole size—of the package 120 of the known power device 100.

The chip 305 does not necessarily have to be mounted on the support surface 330s solely at the lower portion 340 of the insulating body 320 for avoiding any risk of damaging the chip. Indeed, portions of the chip 305 may also be located at the upper section 345 of the insulating body 320, since the upper section 345 according to an embodiment of the present disclosure does not have to be crossed by any insertable fastener element.

According to another embodiment of the present disclosure, the insulating body includes the lower portion 340 only, so that the thickness—along the direction x—of the insulating body 320 is substantially constant through the whole device.

According to an embodiment of the present disclosure, the power device 300 illustrated in FIGS. 3A-3C is adapted to be fastened to a heatsink by means of an elastic fastener element configured to be placed astride a corresponding portion of the insulating body 320, such as for example a clip fastener element or a clamp fastener element.

FIG. 4A is a perspective view illustrating how the power device 300 of FIGS. 3A-3C is mounted on the heatsink 200 according to an embodiment of the present disclosure.

According to this embodiment of the disclosure, the elastic fastener element used to fasten the power device 300 to the heatsink 200 is a clip element 400 having the shape of a "c", which comprises an elongated main segment 410, and two arm segments 420 which extend from the two ends of the main segment 410 substantially perpendicular thereto. The main segment 410 has a length corresponding to the width (along the direction z) of the lower portion 340 of the insulating body 320, while each arm segment 420 has a length corresponding to the thickness (along the direction x) of the lower portion 340 of the insulating body 320. The clip element 400 is made in an elastic material, such as for example harmonic steel.

Two slits 425 are located on the face 202 of the heatsink 200 at a reciprocal distance corresponding to the width (along the direction z) of the lower portion 340 of the insulating body 320. Each slit 425 extends completely through the heatsink 200 from the face 202 to the opposite face 204. The free end of each arm segment 420 of the clip element 400 is provided with a corresponding engaging portion 430 adapted to fit into a corresponding slit 425.

In order to fasten the power device 300 to the heatsink 200, the power device 300 is positioned on the heatsink 200 with the back surface 328 of the former that is in contact with the face 202 of the latter, ensuring that each slit 425 is located in proximity of a respective lateral side of the power device insulating body 320. Then, the clip element 400 is placed astride the power device 300—specifically, astride the lower portion 340 of the insulating body 320—and fastened to the heatsink 200 by inserting the engaging portions 430 into the slits 425. Being the clip element 400 made in an elastic material, the engaging portions 430 thereof snap-fits into the slits 425, coming out from the other side of the heatsink 200 and placing in contact with the (back) face 204 thereof. In this situation, illustrated in the side view depicted in FIG. 4B, the power device 300 is firmly fitted between the clip element 400 and the heatsink 200, with the front face 350 of the power device 300 that is contact with the main segment 410 of the clip element 400 and the back surface 328 of the power device 300 that is in contact with the face 202 of the heatsink 200. Preferably, the clip element 400 has the main segment 410 which is slightly curved downward (i.e., toward the area delimited by the "c") in such a way to exert pressure (along the direction x) against the front face 350 of the insulating body 320 when mounted on the heatsink 200, improving the stability of the power device-heatsink assembly.

FIG. 5A is a perspective view illustrating how the power device 300 of FIGS. 3A-3C is mounted on the heatsink 200 according to a further embodiment of the present disclosure.

According to this embodiment of the disclosure, the elastic fastener element used to fasten the power device 300 to the heatsink 200 is a clamp element 500 having the shape of a "c", which comprises two elongate arm segments 510, 520 connected to each other by means of a joint section 530. The arm segments 510, 520 are spaced to each other by a distance corresponding to about the thickness (along the direction x) of the insulating package 320 (at the lower portion 340 thereof) plus the thickness of the heatsink 200. The clamp element 500 is made in an elastic material, such as for example harmonic steel, with the joint section 530 that exerts an elastic force causing the two arm segments 510, 520 to be pushed one against the other.

In order to fasten the power device 300 to the heatsink 200, the power device 300 is positioned on the face 202 of the heatsink 200. Then, the clamp element 500 is slid along the direction y so as to clamp together the power device 300 and the heatsink 200. As illustrated in the side view depicted in FIG. 5B, once inserted astride (a portion of) the insulating body 320 of the power device 300 and the heatsink 200, the elastic force of the joint section 530 causes the arm segment 510 to push against the front face 350 of the insulating body 320 and the arm segment 520 to push against the back face 204 of the heatsink 200. In this situation, the power device 300 and the heatsink 200 are firmly fitted between the two arm segments 510, 520 of the clamp element 500, with the back surface 328 of the power device 300 that is in contact with the face 202 of the heatsink 200.

Making reference again to FIGS. 3A-3C, according to an embodiment of the present disclosure, the insulating body 320 is further provided with a groove 380 located at the corner between the lower end 327 and the back surface 328, which extends along the direction x from the lateral face 360 to the lateral face 365. As visible in FIGS. 4B and 5B, the presence of such groove 380 advantageously increases (with respect to the known solution illustrated in FIG. 2B) the creepage distance 490 between the electrodes 325(1), 325(2), 325(3) and the face 202 of the heatsink 200.

Naturally, a person skilled in the art may apply to the solution described above many logical and/or physical modifications and alterations. More specifically, although the present disclosure has been described with a certain degree of particularity with reference to preferred embodiments thereof, it should be understood that various omissions, substitutions and changes in the form and details as well as other embodiments are possible. In particular, different embodiments of the disclosure may even be practiced without the specific details (such as the numeric examples) set forth in the preceding description for providing a more thorough understanding thereof; on the contrary, well known features may have been omitted or simplified in order not to obscure the description with unnecessary particulars. Moreover, it is expressly intended that specific elements and/or method steps described in connection with any disclosed embodiment of the disclosure may be incorporated in any other embodiment as a matter of general design choice. The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device for power applications configured to be mounted on a printed circuit board and fastened to a heatsink having a main surface, the electronic device comprising:
   a semiconductor chip integrating a power component and including conductive terminals; and
   a package that includes:
      an insulating body embedding the semiconductor chip and including a back surface configured to contact the main surface of the heat sink,
      exposed electrodes for electrically connecting the conductive terminals of the semiconductor chip to external circuitry on the printed circuit board; and
      an elastic fastener element configured to be placed astride a corresponding portion of the main section of the insulating body and configured to fasten the electronic device to the heat sink, the elastic fastener element having a main segment with first and second ends, a first arm segment extending from the first end of the main section and a second arm segment extending from the second end of the main section, the first arm segment being configured to engage with a first slit of the heat sink and the second arm segment being configured to engage with a second slit of the heat sink.

2. The electronic device of claim 1, further comprising:
   a support element embedded in the insulating body and having a support surface on which the semiconductor chip is mounted, the insulating body including a main section having a front face and an opposite back face corresponding to the back surface of the insulating body, the support surface of the support element extending at least along the main section of the insulating body so that the semiconductor chip is at least partially embedded in the main section of the insulating body.

3. The electronic device of claim 2, wherein the elastic fastener element is configured to fasten the electronic device to the heatsink with the front face of the main section of the insulating body in contact with the main segment of the clip element and the back surface of the insulating body in contact with the main surface of the heatsink.

4. The electronic device of claim 1, wherein the insulating body lacks a hole for receiving an insertable fastener element for fastening the electronic device to the heatsink.

5. The electronic device of claim 1, wherein said power component includes at least one of:
   a power BJT;
   a power MOSFET; and
   a power diode.

6. An electronic power device assembly configured to be mounted on a printed circuit board, the assembly comprising:
   a heatsink having a main surface and a plurality of slits;
   an electronic power device that includes a semiconductor chip, and a package, the semiconductor chip including an integrated power component integrated and conductive terminals, the package including:
an insulating body embedding the semiconductor chip and including a main section having a front face and a back face contacting the main surface of the heat sink, and
exposed electrodes configured to electrically couple the conductive terminals of the semiconductor chip to external circuitry on the printed circuit board; and
an elastic fastener element placed astride a corresponding portion of the main section of the insulating body and configured to fasten the electronic device to the heat sink, the elastic fastener element having a main segment with first and second ends, a first arm segment extending from the first end of the main section and a second arm segment extending from the second end of the main section, the first arm segment engaging with a first of the plurality of slits of the heat sink and the second arm segment engaging with a second of the plurality of slits of the heat sink.

7. The assembly of claim 6, wherein the electronic power device includes:
a support element embedded in the insulating body and having a support surface on which the semiconductor chip is mounted, the support surface of the support element extending at least along the main section of the insulating body so that the semiconductor chip is at least partially embedded in the main section of the insulating body.

8. The assembly of claim 6, wherein:
the front face of the main section of the insulating body is in contact with the main segment of the elastic fastener element and the back surface of the insulating body in contact with the main surface of the heatsink.

9. The assembly of claim 6, wherein the insulating body lacks a hole for receiving an insertable fastener element for fastening the electronic device to the heatsink.

10. The assembly of claim 6, wherein said power component includes at least one of:
a power BJT;
a power MOSFET; and
a power diode.

11. The assembly of claim 6, wherein forming said power component includes forming at least one of:
a power BJT;
a power MOSFET, and
a power diode.

12. A method, comprising:
forming an electronic power device for power applications configured to be mounted on a printed circuit board and fastened to a heatsink having a main surface, wherein forming the electronic power device includes:
forming a semiconductor chip integrating a power component and including conductive terminals, and
forming a package, including:
forming an insulating body embedding the semiconductor chip and including a back surface configured to contact the main surface of the heat sink,
forming exposed electrodes configured to electrically couple the conductive terminals of the semiconductor chip to external circuitry on the printed circuit board; and
forming an elastic fastener element configured to be placed astride a corresponding portion of the main section of the insulating body and configured to fasten the electronic device to the heat sink, the elastic fastener element having a main segment with first and second ends, a first arm segment extending from the first end of the main section and a second arm segment extending from the second end of the main section, the first arm segment being configured to engage with a first slit of the heat sink and the second arm segment being configured to engage with a second slit of the heat sink.

13. The method of claim 12, wherein forming the electronic power device includes:
forming a support element embedded in the insulating body and having a support surface on which the semiconductor chip is mounted, the support surface of the support element extending at least along the main section of the insulating body so that the semiconductor chip is at least partially embedded in the main section of the insulating body.

14. The method of claim 12, further comprising fastening the electronic device to the heatsink, wherein:
the elastic fastener element fastening the electronic device to the heatsink with the front face of the main section of the insulating body in contact with the main segment of the elastic fastener element and the back surface of the insulating body in contact with the main surface of the heatsink.

15. The method of claim 12, wherein forming the insulating body includes forming the insulating body without a hole for receiving an insertable fastener element for fastening the electronic device to the heatsink.

* * * * *